United States Patent
Kobayashi

(10) Patent No.: US 10,510,760 B1
(45) Date of Patent: Dec. 17, 2019

(54) METHOD FOR FABRICATING BIT LINE CONTACT

(71) Applicant: Micron Technology, Inc., Boise, ID (US)

(72) Inventor: Naoyoshi Kobayashi, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/053,505

(22) Filed: Aug. 2, 2018

(51) Int. Cl.
*H01L 27/108* (2006.01)
*H01L 21/768* (2006.01)
*H01L 21/02* (2006.01)
*H01L 21/3213* (2006.01)
*H01L 21/3205* (2006.01)
*H01L 23/532* (2006.01)
*H01L 23/528* (2006.01)

(52) U.S. Cl.
CPC .... *H01L 27/10888* (2013.01); *H01L 21/0217* (2013.01); *H01L 21/02164* (2013.01); *H01L 21/02238* (2013.01); *H01L 21/02532* (2013.01); *H01L 21/02595* (2013.01); *H01L 21/32055* (2013.01); *H01L 21/32133* (2013.01); *H01L 21/76802* (2013.01); *H01L 21/76846* (2013.01); *H01L 21/76877* (2013.01); *H01L 21/76888* (2013.01); *H01L 23/528* (2013.01); *H01L 23/53271* (2013.01); *H01L 23/53295* (2013.01); *H01L 27/10885* (2013.01)

(58) Field of Classification Search
CPC ................................................. H01L 27/10888
See application file for complete search history.

(56) References Cited

U.S. PATENT DOCUMENTS

| | | | | |
|---|---|---|---|---|
| 6,020,236 A | * | 2/2000 | Lee | H01L 27/10852 257/E21.648 |
| 6,265,743 B1 | * | 7/2001 | Sakai | H01L 21/76232 257/305 |
| 6,680,511 B2 | * | 1/2004 | Kim | H01L 21/76831 257/332 |
| 8,987,805 B2 | * | 3/2015 | Nam | H01L 29/7926 257/324 |
| 9,142,536 B2 | * | 9/2015 | Kim | H01L 27/0207 |
| 2002/0022321 A1 | * | 2/2002 | Liao | H01L 27/10855 438/255 |
| 2005/0277287 A1 | * | 12/2005 | Chen | G03F 9/7076 438/637 |
| 2006/0073691 A1 | * | 4/2006 | Yoon | H01L 21/76897 438/597 |
| 2006/0086960 A1 | * | 4/2006 | Arai | H01L 27/10852 257/303 |

(Continued)

*Primary Examiner* — William A Harriston
(74) *Attorney, Agent, or Firm* — Dorsey & Whitney LLP

(57) ABSTRACT

Disclosed herein is a method that includes: forming a composite layer, the composite layer comprising first and second insulative materials and a first polysilicon layer that is between the first and second insulative materials, forming a hole in the composite layer, the hole penetrating through the composite layer to define respective edge portions of the first and second insulative materials and the first polysilicon layer, and converting the edge portion of the first polysilicon layer into third insulative material so that the third insulative material is between the respective edges of the first and second insulative materials.

28 Claims, 9 Drawing Sheets

(56) References Cited

U.S. PATENT DOCUMENTS

| | | | |
|---|---|---|---|
| 2006/0131632 A1* | 6/2006 | Chae | H01L 27/10852 257/300 |
| 2008/0093741 A1* | 4/2008 | Lee | H01L 27/10888 257/755 |
| 2010/0093149 A1* | 4/2010 | Ohtsuka | H01L 27/10814 438/386 |
| 2012/0112269 A1* | 5/2012 | Kim | H01L 21/76897 257/330 |
| 2015/0126013 A1* | 5/2015 | Hwang | H01L 27/10888 438/381 |

* cited by examiner

METHOD FOR FABRICATING BIT LINE CONTACT

BACKGROUND

A bit line contact that connects a cell transistor of a DRAM (Dynamic Random Access Memory) and a bit line to each other is made of a doped polysilicon filled in a bit contact hole. The bit contact hole is an opening formed in a multilayered structure. When a non-doped polysilicon is used as a dielectric film including the multilayered structure, a dopant may diffuse from the doped polysilicon constituting the bit line contact to the non-doped polysilicon constituting the dielectric film including the multilayered structure. In this case, a part of the non-doped polysilicon changes to a doped polysilicon having some conductivity, which causes a problem that a bit line capacitance is increased. Furthermore, if the dopant diffuses, the dopant concentration in the doped polysilicon constituting the bit line contact is decreased and thus another problem occurs that the resistance value of the bit line contact is increased.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure that may be practiced. These embodiments are described in sufficient detail to enable those skilled in the art to practice embodiments of the disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
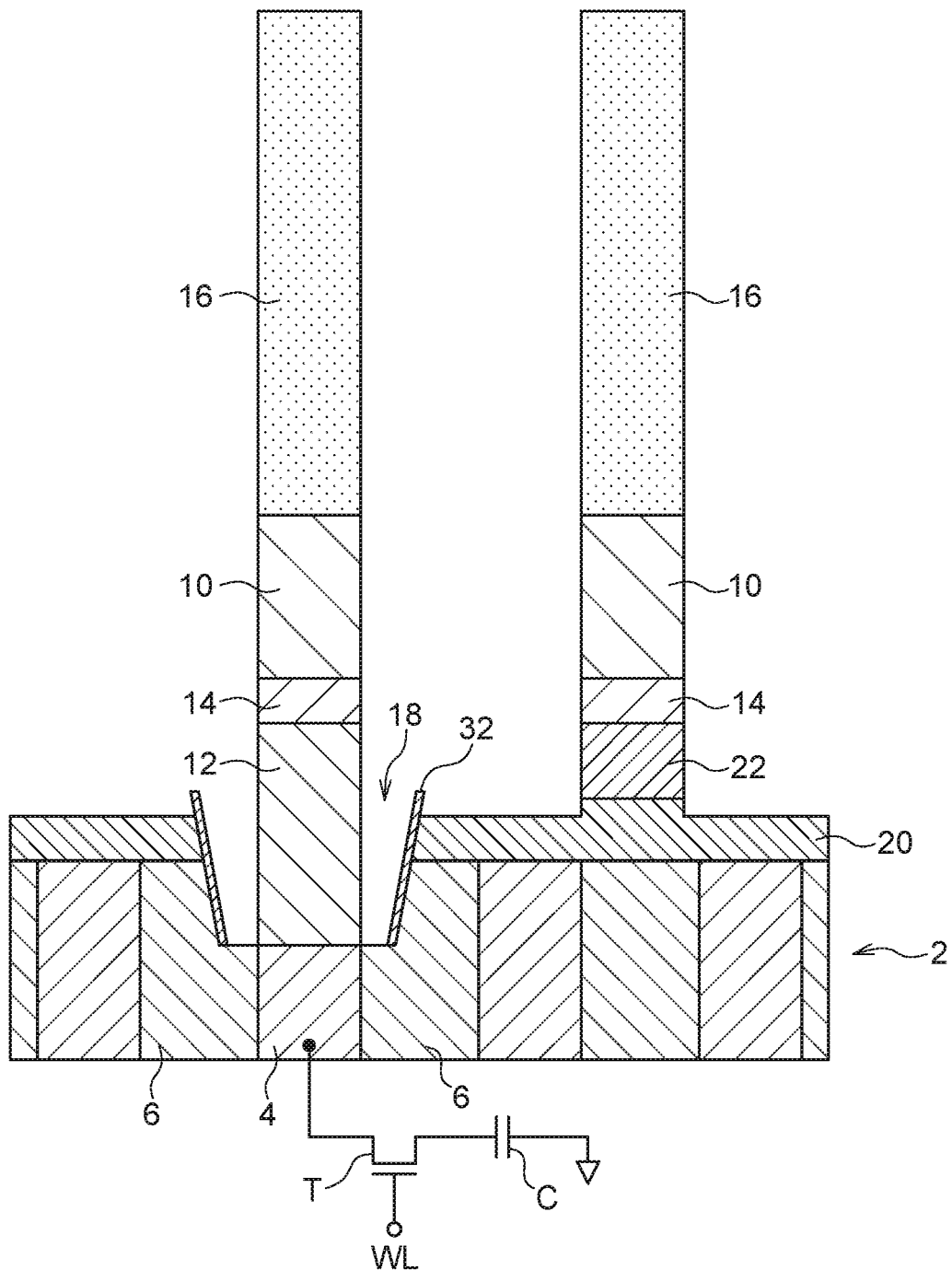
FIG. 1 is a schematic sectional diagram showing a configuration of a semiconductor device according to some embodiments of the disclosure.

A semiconductor device according to the present embodiment is a DRAM and has a cell transistor T as illustrated in FIG. 1. However, the subject of the present disclosure is not limited to a DRAM. The cell transistor T is formed in an active region 4 provided in a semiconductor substrate 2. The active region 4 is defined by STI regions 6. The cell transistor T is connected between a bit line 10 and a cell capacitor C. A word line WL is connected to a gate electrode of the cell transistor T.

The bit line 10 is connected to the cell transistor T via a bit line contact 12 and a barrier metal layer 14. The bit line contact 12 is provided in a bit contact hole 18. An inner wall of the bit contact hole 18 is covered by a silicon nitride film 32. It does not matter if a part or the whole of the silicon nitride film 32 is lost during the manufacturing process. The bit line 10 is made of, for example, tungsten (W), the bit line contact 12 is made of, for example, a doped polysilicon, and the barrier metal 14 is made of, for example, a tungsten nitride (WN) or a titanium nitride (TiN). A hard mask 16 made of a silicon nitride is provided on the bit line 10. The hard mask 16 is a mask layer used for patterning of the bit line 10, the barrier metal layer 14, and the bit line contact 12.

The bit line 10 (on the left side) located on the bit line contact 12 and the bit line 10 (on the right side) not located on the bit line contact 12 are illustrated in a cross-section illustrated in FIG. 1. As illustrated in FIG. 1, a part of the bit line 10 not located on the bit line contact 12 is placed above a silicon dioxide film 20 and a non-doped polysilicon film 22.

Figure 2:
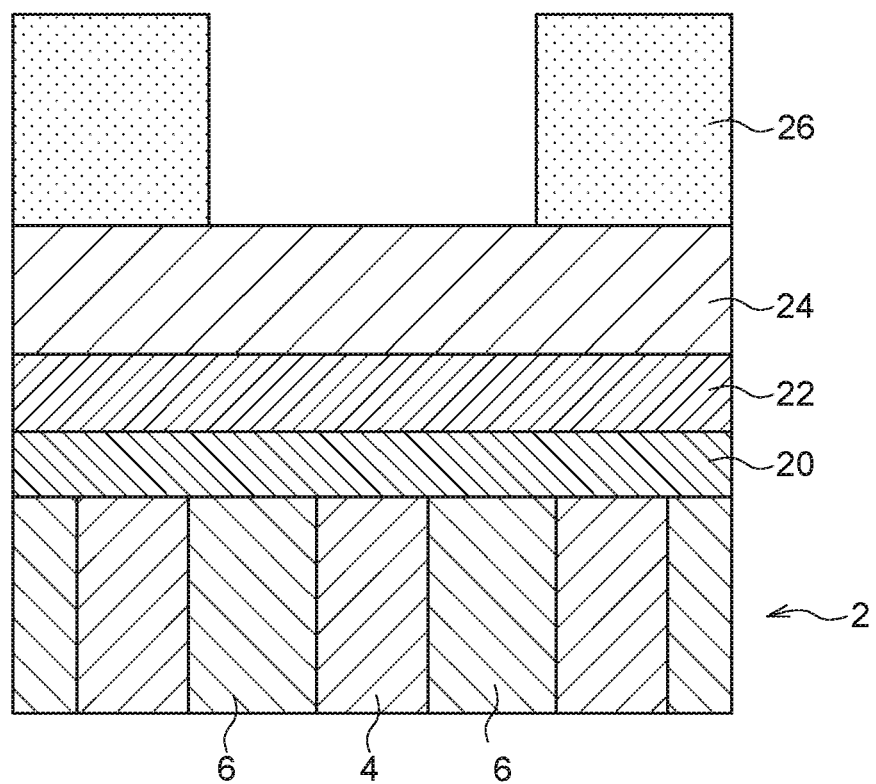
FIG. 2 to FIG. 12 are process diagrams for explaining a manufacturing method of the semiconductor device shown in FIG. 1 according to some embodiments of the disclosure.
Figure 3:
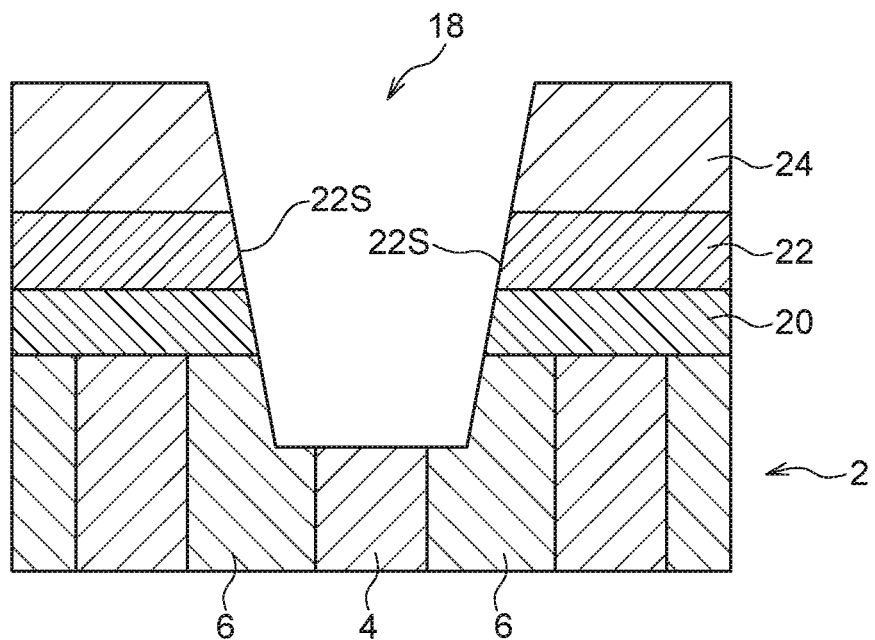

The manufacturing process of the bit line contact 12 and the bit line 10 is explained next. First, after forming a cell transistor T in the active region 4 of the semiconductor substrate 2, a composite layer including a first silicon dioxide film 20 as first insulative material, a non-doped polysilicon film 22 as a polysilicon layer, and a second silicon dioxide film 24 as second insulative material is formed one on top of another in this order as illustrated in FIG. 2. Next, a resist film 26 is formed on a surface of the second silicon dioxide film 24 and the resist film 26 in a region in which the bit contact hole 18 is to be formed is removed by a photolithography method. A multilayered structure as the composite layer including the second silicon dioxide film 24, the non-doped polysilicon film 22, and the first silicon dioxide film 20 is patterned in this state, whereby the bit contact hole 18 illustrated in FIG. 3 is formed. The active region 4 in which the cell transistor T is formed is exposed on a bottom of the bit contact hole 18. A side surface 22s of the non-doped polysilicon film 22 is exposed on an inner wall of the bit contact hole 18. Thereafter, the resist film 26 is removed.

Figure 4:
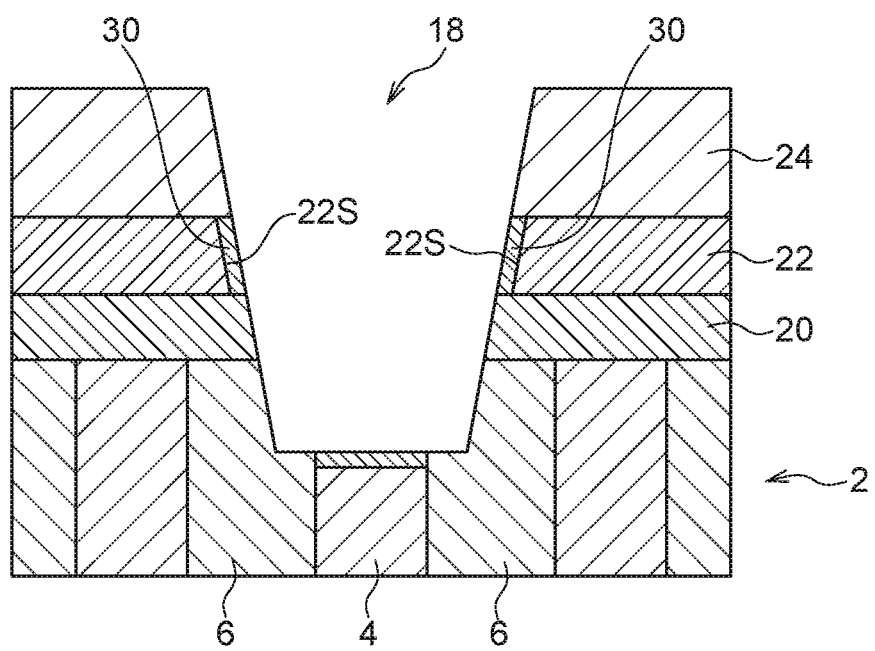

Subsequently, the side surface 22s of the non-doped polysilicon film 22 exposed on the inner wall of the bit contact hole 18 is converted, for example, oxidized by an ashing treatment to form a silicon dioxide film 30 as third insulative material as illustrated in FIG. 4. The side surface 22s of the non-doped polysilicon film 22 is thereby entirely covered by the silicon dioxide film 30. A surface of the active region 4 is also oxidized by the ashing treatment.

Figure 5:
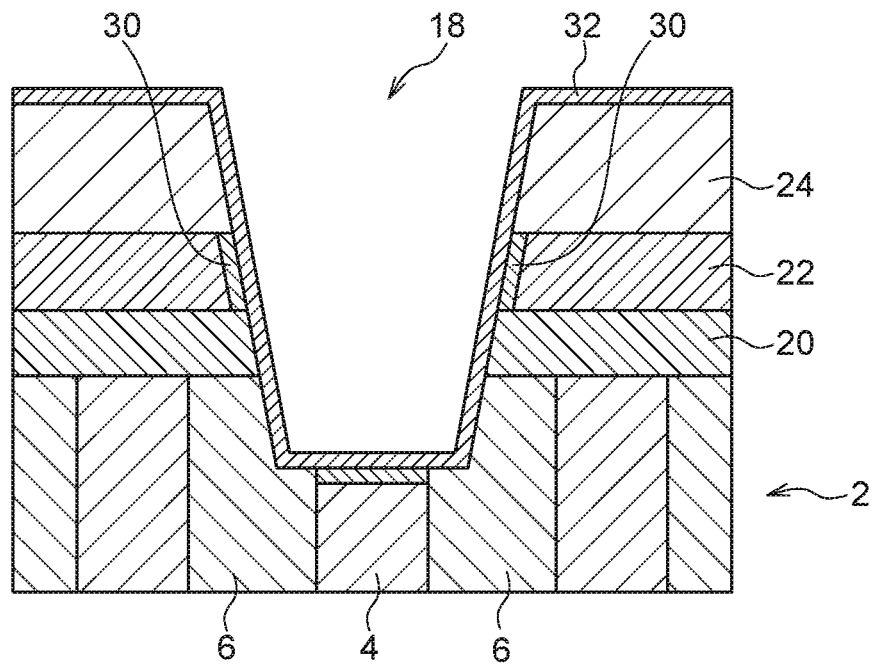
Figure 6:
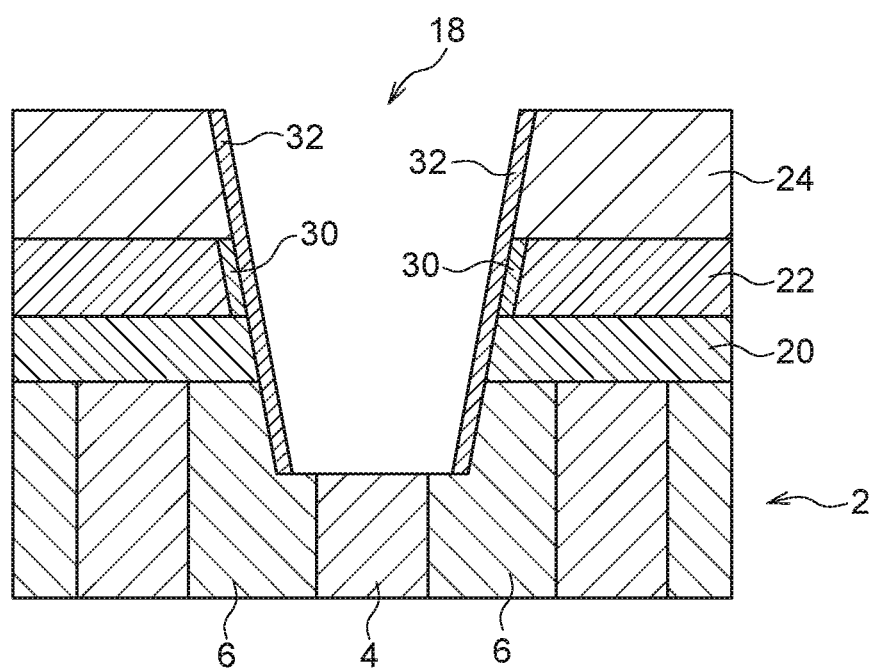

Next, as illustrated in FIG. 5, after a silicon nitride film 32 as additional material is entirely formed, the silicon nitride film 32 is etched back. Accordingly, the silicon nitride film 32 remains on an inner wall portion of the bit contact hole 18 as illustrated in FIG. 6. As a result, the side surface 22s of the non-doped polysilicon film 22 is covered by double protection films including the silicon dioxide film 30 and the silicon nitride film 32. A pretreatment using a hydrofluoric acid is thereafter performed to remove the silicon dioxide film formed on the surface of the active region 4. This pretreatment is a pretreatment for formation of a doped polysilicon film 12A, which is performed subsequently. It suffices that the silicon nitride film 32 has a sufficient film thickness to protect the silicon dioxide film 30 in the pretreatment described above and the film thickness of the silicon nitride film 32 can be smaller than that of the silicon dioxide film 30.

Figure 7:
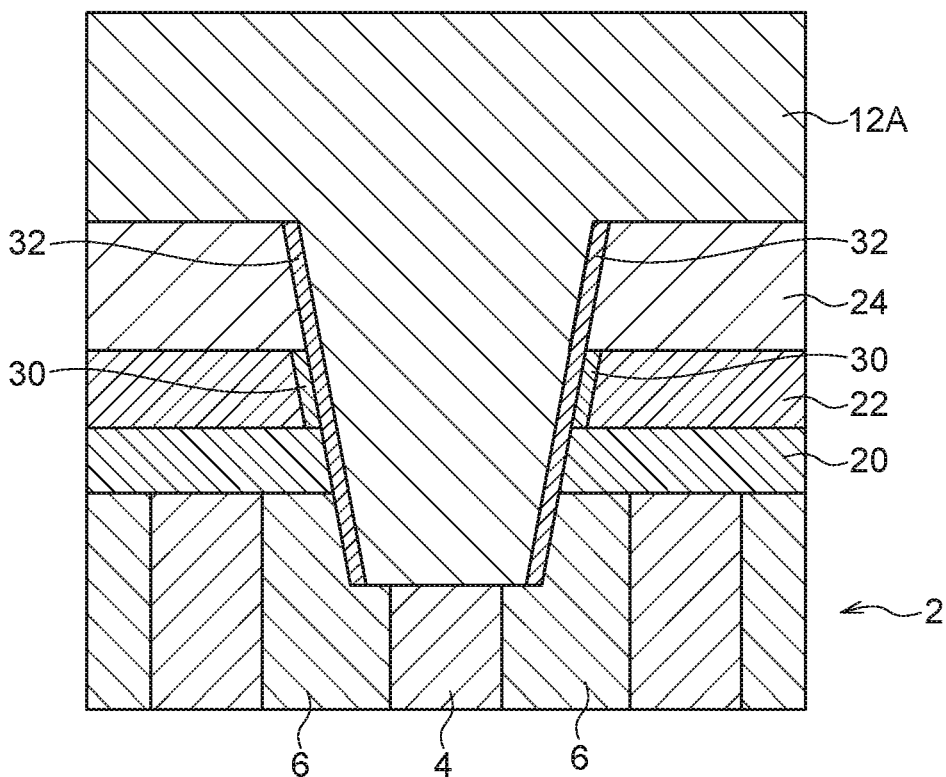

Subsequently, the doped polysilicon film 12A as a second additional material is formed using a CVD (Chemical Vapor Deposition) method to fill the bit contact hole 18 therewith as illustrated in FIG. 7. The double protection films including the silicon dioxide film 30 and the silicon nitride film 32 are located between the doped polysilicon film 12A filled in the bit contact hole 18 and the non-doped polysilicon film 22. Therefore, a dopant such as phosphorus (P) included in the doped polysilicon film 12A does not diffuse to the non-doped polysilicon film 22. Furthermore, even if a part of the silicon nitride film 32 is lost by the pretreatment described above, migration of the dopant does not occur because the side surface 22s of the non-doped polysilicon film 22 is covered by the silicon dioxide film 30.

Figure 8:
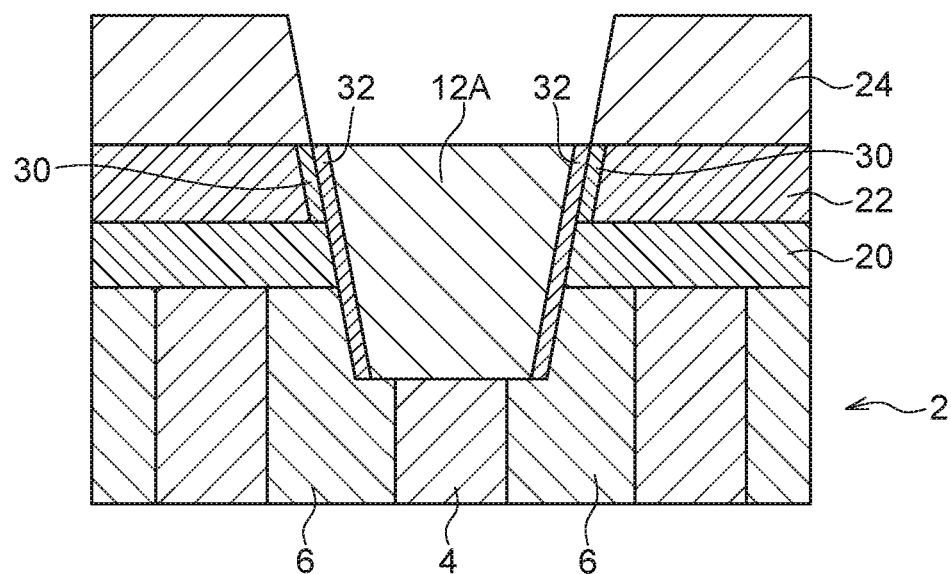

Next, the doped polysilicon film 12A is etched back as illustrated in FIG. 8. The etching-back amount needs to be an amount etching back the doped polysilicon film 12A at least until a top surface of the second silicon dioxide film 24 is exposed and it is preferable that the doped polysilicon film 12A be etched back until a top surface of the doped polysilicon film 12A becomes substantially flush with a top surface of the non-doped polysilicon film 22.

Figure 9:
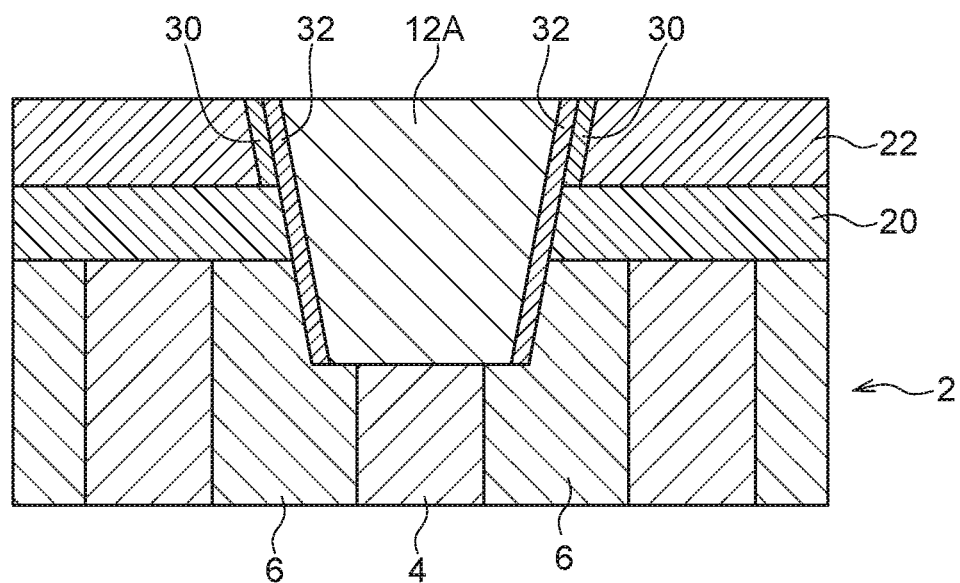
Figure 10:
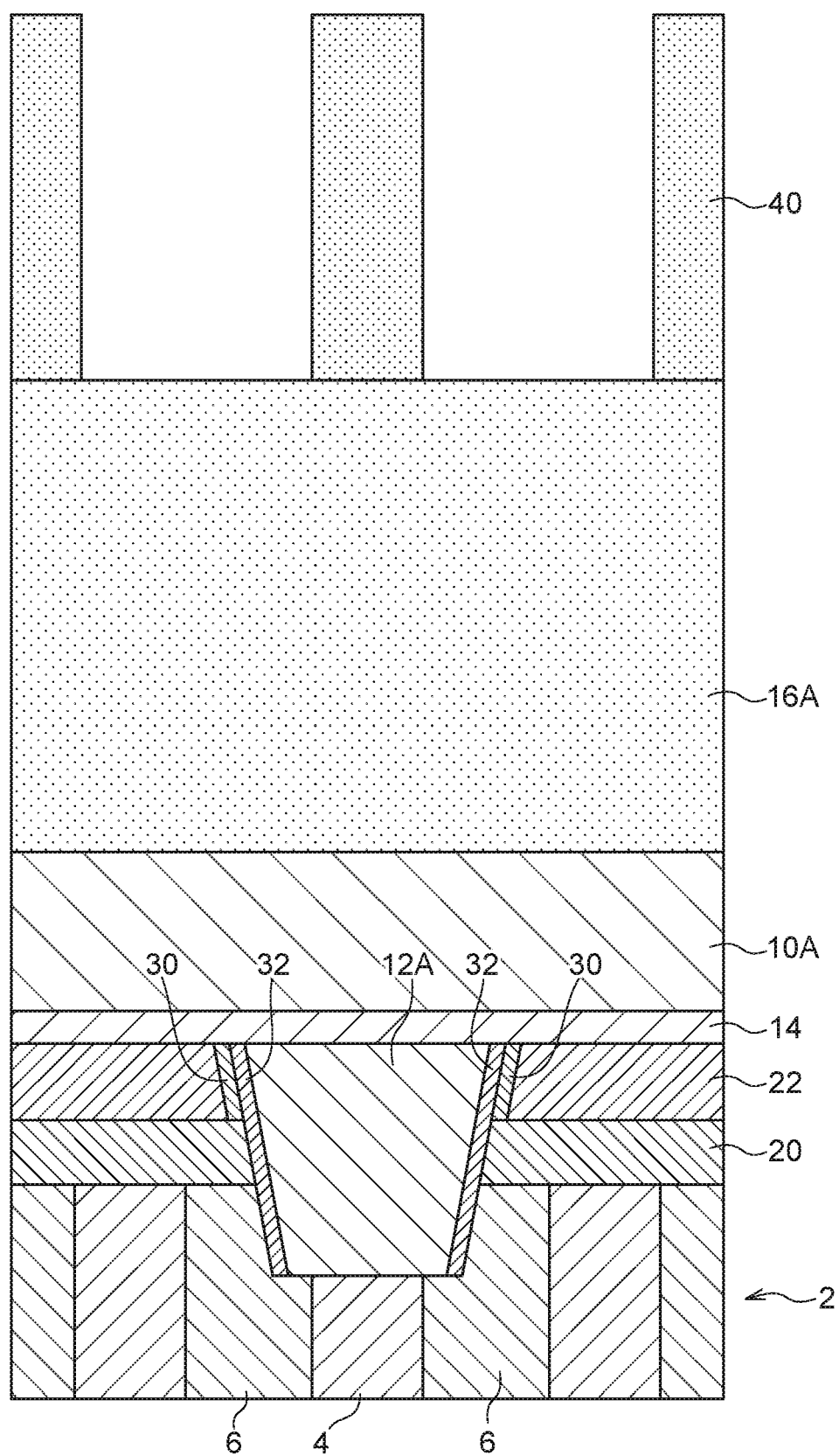
Figure 11:
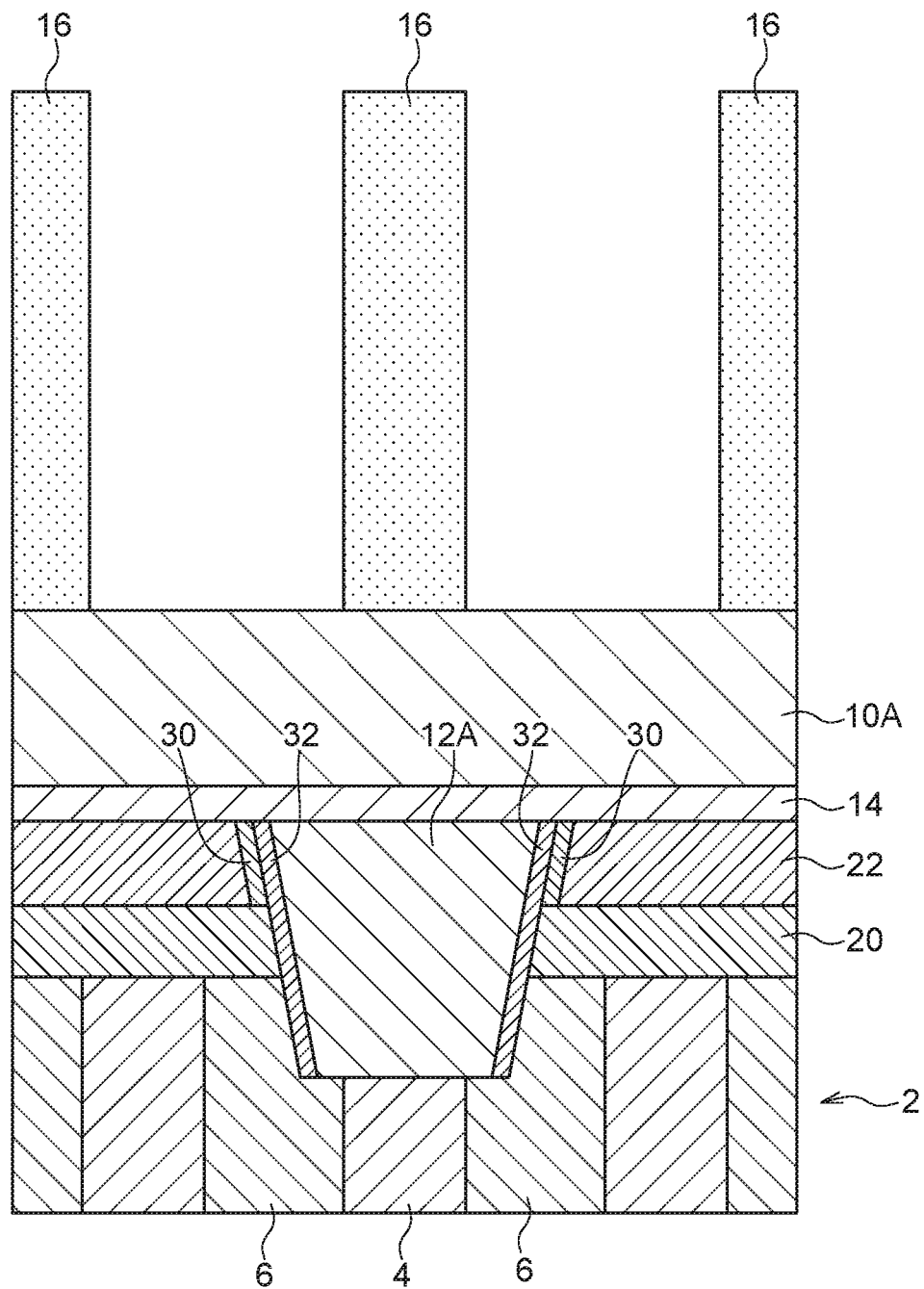

Subsequently, after the second silicon dioxide film 24 is removed as illustrated in FIG. 9, the barrier metal layer 14, a metal layer 10A, a silicon nitride film 16A, and a resist film 40 are formed on top of another in this order and parts of the resist film 40 other than regions in which the hard mask 16 is to be formed are removed by the photolithography method as illustrated in FIG. 10. The silicon nitride film 16A is patterned in this state, whereby the hard mask 16 is formed as illustrated in FIG. 11. The metal layer 10A, the barrier metal layer 14, and the doped polysilicon film 12A/the non-doped polysilicon film 22 are patterned using the hard mask 16 as a mask to form the bit line 10 and the bit line contact 12 as illustrated in FIG. 1. The patterning described above can be performed by overetching using the first silicon dioxide film 20 as a stopper. Therefore, the silicon dioxide film 30 formed on the side surface 22s of the non-doped polysilicon film 22 may be lost at this stage. Then, interlayer insulating film and a cell capacitor C (not shown in FIG. 1) and the like are formed, whereby the DRAM according to the present embodiment is completed.

Figure 12:
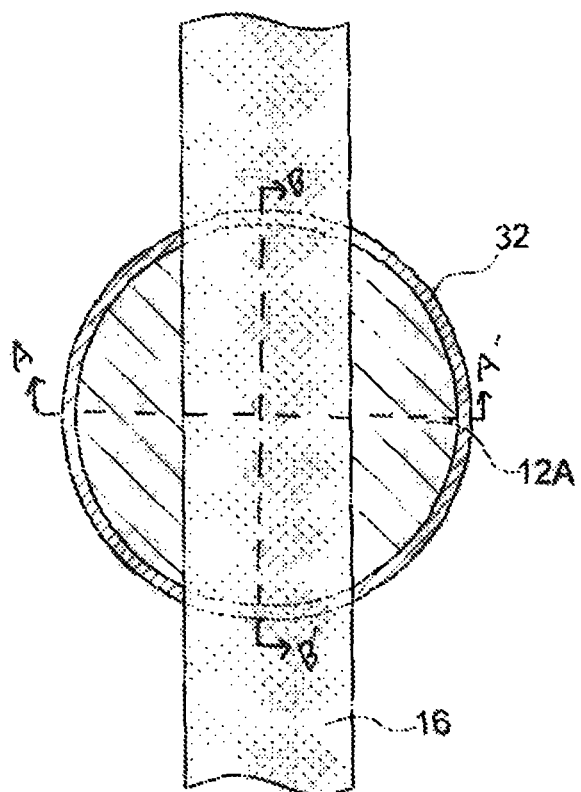

As described above, the side surface 22s of the non-doped polysilicon film 22 exposed on the inner wall of the bit contact hole 18 is covered by the double protection films including the silicon dioxide film 30 and the silicon nitride film 32 in the present embodiment. Therefore, the dopant such as phosphorus (P) included in the doped polysilicon film 12A does not diffuse to the non-doped polysilicon film 22. Furthermore, because it suffices that the silicon nitride film 32 has a minimum film thickness, a sufficient opening area of the doped polysilicon film 12A is ensured at the time of etching of the doped polysilicon film 12A as illustrated in FIG. 12 being a plan view. A sectional view on the line A-A' of FIG. 12 corresponds to the sectional view of the area including the hole 18 in FIG. 11. That is, if the film thickness of the silicon nitride film 32 is large, the opening area of the doped polysilicon film 12A is decreased correspondingly and there is a risk that an etching failure of the doped polysilicon film 12A is caused by a micro-loading effect. However, because the side surface 22s of the polysilicon film 22 is oxidized in the present embodiment, it suffices that the silicon nitride film 32 has a minimum film thickness and thus an etching failure of the doped polysilicon film 12A due to the micro-loading effect can also be prevented. The hard mask 16 is patterned to extend along B-B' line in FIG. 12. Therefore, in FIG. 1, the bit line 10 is patterned to extend along the B-B' line to be formed inside of the bit contact hole 18 and on the first silicon dioxide film 20.

As a second exemplary embodiment, the silicon nitride film 32 in FIG. 1 may be replaced with polysilicon liner. That is, in FIG. 5, polysilicon liner 32 with doped or non-doped is deposited. Then the polysilicon liner 32 is etched back as shown in FIG. 6. Then, after a cleaning is performed, the doped polysilicon film 12A is formed over the polysilicon liner 32 as shown in FIG. 7. In this case, the silicon oxide film 30 is not removed by the cleaning because the silicon oxide film 30 is covered with the polysilicon liner 32. Then, the doped polysilicon film is etched back to form a bit line contact (plug) as a part of the doped polysilicon film 12A as shown in FIG. 8. In this case, the size (horizontal diameter) of the bit line contact of the second embodiment is larger than the size of the bit line contact of the first embodiment, which has two material structure including the doped polysilicon layer 32 and the silicon nitride film 32. Therefore, the second embodiment can more preferably prevent from the micro loading issue.

Although various embodiments of the disclosure have been disclosed in the context of certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of this disclosure will be readily apparent to those of skill. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of embodiments of the disclosure. Thus, it is intended that the scope of at least some of the disclosure should not be limited by the particular disclosed embodiments described above.

The invention claimed is:

1. A method comprising:
   forming a composite layer, the composite layer comprising first and second insulative materials and a first polysilicon layer that is between the first and second insulative materials;
   forming a hole in the composite layer, the hole penetrating through the composite layer to define respective edge portions of the first and second insulative materials and the first polysilicon layer; and
   converting the edge portion of the first polysilicon layer into third insulative material so that the third insulative material is between the respective edges of the first and second insulative materials.

2. The method of claim 1, further comprising:
   forming an additional layer covering a sidewall of the hole after converting the edge portion of the first polysilicon layer into the third insulative material.

3. The method of claim 2, further comprising:
   after forming the additional layer, filling the hole with a second polysilicon layer.

4. The method of claim 3, wherein the second polysilicon layer has greater in dopant concentration than the first polysilicon layer.

5. The method of claim 4, wherein the first polysilicon layer comprises a non-doped polysilicon.

6. The method of claim 4, wherein the third insulative material is converted by oxidizing the edge portion of the first polysilicon layer.

7. The method of claim 6, wherein the oxidizing is performed by an ashing treatment.

8. The method of claim 4, wherein the third insulative material is thicker than the additional layer.

9. The method of claim 4, wherein the additional layer is silicon nitride layer.

10. The method of claim 4, wherein the additional layer is polysilicon layer.

11. The method of claim 3, further comprising forming a metal layer on the second polysilicon layer.

12. The method of claim 1, wherein the first and second insulative materials comprise a silicon oxide.

13. A method comprising:
forming a composite layer including first and second dielectric layers and a non-doped polysilicon layer positioned between the first and dielectric layers;
patterning the composite layer to form an opening that exposes a side surface of the non-doped polysilicon layer;
oxidizing the side surface of the non-doped polysilicon layer to form an oxide layer;
forming an additional layer on the oxide layer; and
filling the opening with a doped polysilicon layer.

14. The method of claim 13, wherein the first and second dielectric layers comprise a silicon oxide.

15. The method of claim 13, wherein the oxidizing is performed by an ashing treatment.

16. The method of claim 13, wherein the oxide layer is thicker than the additional layer.

17. The method of claim 13, further comprising:
etching back the doped polysilicon layer until the second dielectric layer is exposed;
removing the second dielectric layer to expose the non-doped polysilicon layer; and
patterning the doped polysilicon layer and the non-doped polysilicon layer simultaneously.

18. The method of claim 17, further comprising forming a metal layer on the doped polysilicon layer and the non-doped polysilicon layer after removing and before the patterning.

19. The method of claim 18, wherein the metal layer is a bit line.

20. An apparatus comprising:
first insulative material having a first upper surface and a first side surface extending downwardly from an edge of the first upper surface;
first polysilicon material over the first insulative material, the first polysilicon material having a second upper surface and a second side surface extending downwardly from an edge of the second upper surface, the second side surface being indented from the edge of the first upper surface of the first insulative material to expose a part of the first upper surface;
second insulative material over the part of the first upper surface of the first insulative material to cover the second side surface of the first polysilicon material, the second insulative material having a third side surface on an opposite side to the second side surface of the first polysilicon material; and
additional material covering the first side of the first insulative material and the third side surface of the second insulative material.

21. The apparatus of claim 20, wherein the additional material comprises second polysilicon material.

22. The apparatus of claim 20, wherein the additional material comprises third insulative material.

23. The apparatus of claim 22, the apparatus further comprising:
a second additional material contacting the third insulative material and different in composition from the third insulative material.

24. The apparatus of claim 23, wherein the third insulative material comprises silicon nitride.

25. The apparatus of claim 24, wherein the second additional material comprises a polysilicon.

26. The apparatus of claim 24, further comprising a semiconductor substrate, wherein the semiconductor substrate comprises an active region, and wherein the second additional material is in contact with the active region.

27. The apparatus of claim 26, wherein the second additional material has greater in dopant concentration than the first polysilicon material.

28. The apparatus of claim 27, wherein the first polysilicon material comprises a non-doped polysilicon.

\* \* \* \* \*